US006075310A

United States Patent [19]

Bishop

[11] Patent Number: 6,075,310

[45] Date of Patent: Jun. 13, 2000

[54] ACOUSTIC TRANSDUCER WITH LIQUID-IMMERSED, PRE-STRESSED PIEZOELECTRIC ACTUATOR IN ACOUSTIC IMPEDANCE MATCHED TRANSDUCER HOUSING

[75] Inventor: Richard P Bishop, Fairfax Station, Va.

[73] Assignee: Face International Corp., Norfolk, Va.

[21] Appl. No.: 09/062,084

[22] Filed: Apr. 17, 1998

[51] Int. Cl.[7] .......... H01L 41/04

[52] U.S. Cl. .......... 310/328; 310/334; 310/344

[58] Field of Search .......... 310/337, 334, 310/328, 322, 344

[56] References Cited

U.S. PATENT DOCUMENTS 4,881,212 11/1989 Takeuchi .......... 310/336
5,837,298 11/1998 Face, Jr. et al. .......... 425/456

FOREIGN PATENT DOCUMENTS 61-055696 3/1986 Japan .
3-171899 7/1991 Japan .

*Primary Examiner*—Nestor Ramirez
*Assistant Examiner*—Peter Medley

[57] ABSTRACT

A liquid-filled acoustic transducer for finishing an exposed surface of a work medium, such as plastic concrete, transmits acoustic energy generated within an enclosed liquid medium, through a transducer housing member, and into the exterior work medium. Acoustic waves are generated by electrically-actuated liquid-immersed piezoelectric elements housed within the device. The efficiency with which acoustic waves are transmitted from the interior of the device to the adjacent work medium is enhanced by providing an intermediate transducer housing member, disposed between the liquid in which the piezoelectric elements are immersed and the work medium, having acoustic impedances at its two major surfaces matching the respective acoustic impedances of the respective interfacing media and a continuous acoustic impedance gradient between those two surfaces.

7 Claims, 10 Drawing Sheets

FROM FIG.8

ACOUSTIC TRANSDUCER WITH LIQUID-IMMERSED, PRE-STRESSED PIEZOELECTRIC ACTUATOR IN ACOUSTIC IMPEDANCE MATCHED TRANSDUCER HOUSING

BACKGROUND OF THE INVENTION

1. Field of Invention

The present invention relates to acoustic transducers. More specifically the present invention relates to a liquid-filled acoustic transducer which transmits acoustic energy generated within an enclosed liquid medium, through a transducer housing member, and into an exterior work medium.

2. Description of the Prior Art

The present invention is a unique acoustic energy transducing device which may be advantageously used in a preferred embodiment of the invention to modify the texture or character (i.e. the "finish") of a surface of a work material. For illustrative purposes, the following disclosure describes an application of the preferred embodiment of the invention wherein acoustic energy generated within the tool is introduced into a plastic concrete mass in order to advantageously finish an exposed surface of the plastic concrete mass. It will be understood, however, that similar tools constructed in accordance with the present invention may be used to modify the texture or character of exposed surfaces of many other materials, particularly plastic or wet materials such as plaster, wet soil, cement and the like. It will also become apparent from the following disclosure that similar tools constructed in accordance with the present invention may be used in many applications where it is advantageous or desirable to efficiently pass acoustic waves into work media for purposes other than modifying the character of a surface of the work material. For example, the present invention may be used in SONAR applications or in ultrasonic imaging in order to efficiently transmit and/or receive acoustic signals into or from adjacent work media.

When concrete is initially laid, it must be worked while it is wet in order to provide a smooth, homogeneous mixture. Working the plastic concrete helps settle the concrete and helps to densify and compact the concrete. This working of the plastic concrete also removes air voids and brings excess water and fine aggregates to the surface for subsequent finishing. After the initial finishing stages are complete more detailed work frequently commences, generally by means of hand-held floats, for purposes including the driving of suspended gravel downwards, and developing a wetted surface slurry or soup-like finish, while further driving out air pockets and the like for preparing the surface for final finishing. Thereafter, when the surface slurry is thus formed, it is conventional to employ smoothing or specialty tools (such as edgers and trowels) to provide finishing touches to the work.

It is generally known that, if not worked, the surface of wet concrete would take on a highly undesirable rough and uneven finish which, after partial setting of the concrete, would render the surface difficult, if not impossible, to finish to the desired smooth and even consistency. For this reason, it has long been known in the art that in the act of providing a first, general compacting, tamping, screeding or other such operation following the laying or dumping of the mix, various large vibrating devices may be beneficially employed. These devices generally include a rather large flat base plate, a heavy and bulky vibratory mechanism disposed thereto for moving the large plate across the concrete surface. Such devices are generally intended to provide a general smoothing and compacting operation over a large area.

When the worker has progressed to the aforementioned finishing stage wherein it is desired to provide a highly smooth surface finish, a variety of prior vibrating hand tools may be employed with varying degrees of success. Whereas such tools are, in contrast to the aforementioned larger devices, intended for hand-held operation, they retain several characteristics of the larger apparatus such as being of a rather awkward, large and heavy construction. Whereas such features may in fact be beneficial with respect to the larger devices, in a hand-held tool this bulk, weight and complexity may render the tool totally impractical for use, particularly in view of the fact that the operator is typically working for long periods of time on his knees and often in awkward positions. It must be recognized that these tools are conventionally used primarily in finishing operations wherein a great deal of vibratory energy is not required inasmuch as a mere final smoothing of the surface slurry is being effected. In these instances, a much less bulky vibrating means might be provided although, as discussed above, most designs nevertheless continue to suffer from undue weight, bulk and the like. Notwithstanding, a variety of such vibrating means have been attempted to be employed including plunger-type vibrators, air driven turbine vibrators, and even sonic air-driven orbiting-mass type vibrators.

Another type of prior vibrating hand tool is disclosed in U.S. Pat. No. 5,234,283 to Adkins. In this tool the vibratory mechanism is mounted inside the handle. The vibratory mechanism vibrates a rigid metal blade of relatively large mass by "pushing off" of the handle in an oscillating fashion. An inherent consequence of this construction is that the handle vibrates as much or more than the blade of the tool which contacts the wet concrete. These vibrations cause discomfort and difficulty of use for the operator. As a means of reducing the amount of uncomfortable vibrations transmitted through the handle to the operator, the Adkins device, in practice, is typically manufactured such that the handle/vibratory mechanism is of relatively high mass. As discussed above with respect to other prior vibrating finishing tools, it is undesirable for such tools to be heavy and bulky. Also, because only one vibrating mechanism (i.e. located in the handle and attached to the blade of the tool at one point) is typically used to drive the entire blade in the Adkins device, its blade must be constructed of particularly rigid (and therefore typically heavy and thick) material in order to cause the entire blade to vibrate in phase. A more desirable hand tool would incorporate characteristics that would cause the majority of the vibratory energy to be transmitted to the work concrete through the bottom of the device in an efficient and uniform manner and would not cause significant amounts of vibratory energy to be transmitted to the operator through the handle.

Prior patents in this area are relatively silent regarding determination of the frequency at which the vibrations should be applied to work the concrete. Because little attention is given in the prior art to the importance of determination of the frequency at which vibrations should be applied to the work material, prior vibrating concrete finishing tools typically are not provided with means by which tools' vibration frequencies can be readily changed by the user. Consequently, many prior devices do not vibrate the concrete very efficiently. Most prior concrete finishing vibrating hand tools are operated simply by turning a switch having only two settings: "on" and "off". However, in practice each batch of concrete delivered to a job site is different from the next, and a different frequency of vibration may be required from one batch to another in order to cause the desired slurry to be formed more quickly and more efficiently. This is because the natural frequency of each batch of concrete may be different from the next due to the amount of water, cement and aggregate mix that make up each particular batch. [In this context a "natural frequency" of a concrete mass is a frequency at which a standing vibration wave can be established within the concrete mass.] Accordingly, it would be desirable to provide a vibrating hand tool with multiple frequency settings, at least one of which frequencies corresponds to a natural frequency of the concrete.

Another problem with the prior art relates to the bulk of the device, per se, as well as the bulk of the power supply required to power the device. Some of the prior vibrating hand tools (such as the one disclosed in the patent to Adkins) consist of an electric cord running from the tool to a bulky battery pack which is mounted in a belt and placed around the operator's waist. Because of the inherently low electrical-to-mechanical power conversion efficiency of such devices, and because of the low vibrational energy transmission efficiency between the actuator and adjacent work media of prior devices, it is typically necessary to provide such prior devices with large power supplies. Thus, prior vibrating concrete finishing tools are typically provided with battery packs which are large and heavy, and, if worn on a waist belt, uncomfortable to the operator. In addition, in such prior devices the length of the power cord is such that it may be inadvertently dragged through the concrete. A hand tool with either a battery pack in the handle, or a less bulky hip-pack with a shorter cord would therefore be more desirable.

Common prior hand trowels typically consist of a handle and a flat metal plate which serves as a concrete-engaging blade. The trowel is used to smooth the top layer of poured concrete, but has little effect on air or water below the surface of the concrete. Conventional hand trowels are also hard to use near walls and corners because they must be wiped back and forth over the surface of the plastic concrete, and adjacent walls often present obstructions to such trowelling operations. Conventional hand trowels are also difficult to use for long periods of time because their use is physically demanding due to the high amount of friction between the blade of the tool and the concrete.

Some prior concrete finishing tool comprise gasoline powered vibrating components. Gasoline powered vibrating finishing tools cause noise pollution, harmful exhaust emissions, and do not produce a high enough output frequency to effectively vibrate the medium. They also are hard to control and virtually impossible to use in closed quarters or at edges and corners, because they are large and bulky and do not operate well adjacent to protruding vertical structures (i.e. walls and columns).

Virtually all prior concrete finishing vibratory hand tools are difficult to operate because the entire tool typically vibrates, causing difficulty for the operator.

In the present invention many of the described disadvantages of prior concrete finishing tools are overcome by introducing acoustic energy (rather than surface vibrational waves) into the concrete mass. Although no prior concrete finishing tool involves the controlled introduction of acoustic energy into a concrete work mass, acoustic transducers are known in other arts. However, prior acoustic transducers are typically of limited energy transmission efficiency due to energy transmission losses at the interfaces of adjacent media (e.g. between various internal components of the transducer itself, and between the transducer and the external medium into which the acoustic energy is intended to be transmitted).

It is known that the most efficient transmission of acoustic energy from one medium to an adjacent medium occurs when the acoustic impedances of the two media are matched. When the acoustic impedance of adjacent media are dissimilar, acoustic waves propagating from the first medium toward the second encounter a change in impedance at the interface of the two media, causing at least partial reflection of the acoustic energy back into the first medium. Thus, in order to efficiently transmit sound energy from one medium to an adjacent medium, it is desirable for the acoustic impedances of the two media to be the same at their common interface. A problem arises, however, in transmitting acoustic energy from a first medium, through a second (intermediate) medium and into a third medium, whenever the first and third media have different acoustic impedances. It will be understood that in such instances it is not possible to select an intermediate medium having a uniform acoustic impedance which matches the acoustic impedances of both the first medium and the third medium. To allow effective transmission of the acoustic waves from the first medium to the third, it is desirable for the intermediate (second) medium to have an impedance which changes in the direction of the sound propagation to match that of the first medium and the third medium at their respective interfaces with the intermediate (second) medium.

Illustrative embodiments of patents which have attempted impedance matching are U.S. Pat. Nos. 5,511,296 to Dias et al, 5,423,319 to Bolorforosh, 4,348,904 to Bautista and 5,552,004 to Lorraine et al. A problem with prior impedance matching schemes is that a match is typically made between the first medium and the second medium, or the second medium and the third medium, but never between all three media in a manner that avoids significant and abrupt impedance changes at the interfacing surfaces of the three media, or without introducing additional unmatched acoustic interfacing surfaces. An attempt at matching the acoustic impedance of three adjacent media was disclosed in the patent to Bolorforosh. In the Bolorforosh patent, a method for matching the impedance of the surface of an intermediate medium to that of another medium, preferably human tissue, was disclosed. A problem is that the impedance of the fluid (first medium) in which the sound begins propagating in the Bolorforosh device is not matched to that of the first surface encountered by the sound waves in the intermediate medium. Therefore, in the Bolorforosh device some of the waves will be reflected at this interface due to the impedance difference of the adjacent media.

In an alternative embodiment disclosed in the Bolorforosh patent, the acoustic impedance of both the leading and trailing surfaces of the intermediate medium is partially "matched" to their respective adjacent media by determining an average impedance between each surface and the adjacent medium. This is done by taking the acoustic impedance of the intermediate medium (the housing), and the acoustic impedance of the fluid (the first medium), and averaging them, thus creating an average impedance "matching" layer. The same is done between the housing and the third medium. However, this creates an impedance matching problem at four interfaces instead of two. The sound has to travel from the fluid into the first average impedance "matching" layer, from the "matching" layer into the housing, from the housing to the second "matching" layer, and from the second "matching" layer into the third medium.

The impedance change at each interface is reduced by the inclusion of the average impedance "matching" layers, however, to make it to the third medium without being reflected, the acoustic waves must overcome four separate changes of acoustic impedance instead of only two.

When an acoustic wave encounters a material with a different acoustic impedance, the majority of sound that is reflected is done so at the surface of the new material. Typically, relatively little acoustic energy may be dissipated within the material compared with that which is simply reflected at the surface of the material. Therefore, the more abrupt a change in impedance there is from one material to another in the direction of sound travel, the more sound may be reflected at the interface of the two material surfaces. It therefore would be more desirable to provide an intermediate medium which has a continuous acoustic impedance gradient from one surface to the other, without any abrupt impedance changes, wherein the acoustic impedance of the leading surface matches the respective acoustic impedance of the adjacent medium with which the surface is in contact. It would be desirable for this intermediate medium to be substantially "acoustically transparent". In other words, the sound waves could pass through the substantially "acoustically transparent" medium without encountering any surfaces with abrupt acoustic impedance changes. Therefore, no acoustic waves would be reflected, and maximum efficiency of acoustic energy transfer would be achieved.

In the medical imaging field, an acoustically "transparent" medium is very desirable. In a typical imaging device, sound waves are transmitted into the body. As the acoustic waves encounter structures within the body, some of the waves are reflected due to an impedance change. The reflected waves are then sensed by a transducer, and an image is extrapolated. The higher the quality of acoustic energy transmission and reception, the higher the resolution of the generated visual image. Accordingly, a tool which can maximize the efficiency of acoustic wave transmission into a work medium, and can maximize the efficiency of acoustic waver reception from a work medium, is highly desirable.

A further problem with prior impedance "matching" schemes is that they typically require intricate manufacturing processes, such as adhesively bonding layers of dissimilar materials, or etching, cutting or molding of "microgrooves" into the materials. It is desirable to provide a method of manufacturing an acoustic impedance matching material which does not involve intricate manufacturing processes.

SUMMARY OF THE INVENTION

In view of the foregoing disadvantages inherent in the known types of concrete surface finishing tools now present in the prior art, the present invention provides a liquid-filled piezoelectric transducer wherein the same is arranged to efficiently transmit acoustic energy from a liquid-immersed piezoelectric actuator within a transducer housing, into and through the transducer housing, and ultimately into a work material. A face of the transducer housing is advantageously constructed such that its acoustic impedance at its interior surface is matched to that of the liquid within the housing, and its acoustic impedance at its exterior surface is matched to that of the work medium to which the acoustic energy is being transmitted. A continuous impedance gradient is established between the interior and exterior surfaces of the housing. As such, the general purpose of the present invention is to provide a liquid-filled piezoelectric transducer which improves on the prior art.

As used herein, the terms "acoustic energy" and "acoustic waves" refer to the transmission of mechanical energy by sound, regardless of whether the frequency of vibration of such sound is within an audible or inaudible range (i.e. including sonic, ultrasonic and infrasonic frequencies).

Energy can be transferred from one medium, through an intermediate material, and into a second medium by acoustical waves. The efficiency with which the energy can be transferred from the first medium to the second medium depends, in part, upon the magnitude of the acoustic impedance imposed upon the system by the intermediate material. The magnitude of the acoustic impedance of such a system (i.e. wherein a first medium and a second medium are separated by an intermediate material) primarily depends upon: 1) the surface impedance at the interface of the first medium and the intermediate material, and 2) the acoustic impedance at the interface of the intermediate material and the second medium. It will be understood that the efficiency with which acoustic energy can be transferred from the first medium to the second medium can be advantageously affected by controlling the surface impedance at either (or both) of the medium-to-intermediate material interfaces and by controlling the acoustic impedance of the intermediate material itself.

The magnitude of surface impedance at the interface of any two adjacent media varies directly with the difference in acoustic impedances of the media. Accordingly, surface impedance can be reduced, (indeed virtually eliminated), by matching the acoustic impedances of adjacent media.

In the present invention, an acoustic signal is generated in an oil bath (e.g., a first medium) by the oscillation of a piezoelectric actuator immersed within a bath, and transmitted to a plastic concrete work mass (e.g., a second medium) in order to modify the character of the plastic concrete work mass so that it can be readily finished. The acoustic signal is transferred from the oil bath to the concrete mass through the blade of the tool (e.g., an "intermediate material"). As will be described below, the tool optimizes the efficiency of acoustic energy transfer from the oil bath to the plastic concrete mass by using a blade comprising a material whose acoustic impedance varies continuously between its opposite faces, such that the magnitude of the acoustic impedance of the blade material adjacent the oil bath matches the acoustic impedance of the oil, and such that the magnitude of the acoustic impedance of the blade material adjacent the plastic concrete mass matches the magnitude of the acoustic impedance of the plastic concrete mass.

The oil not only provides an acoustic energy transfer medium between the actuator and the tool's blade but it also is an electrical insulator which advantageously prevents any electrical arcing between the actuator's contacts. The wave energy transferred from the tool's blade to the plastic concrete, vibrates the concrete causing air pockets and water to be driven from the concrete. The water accumulates on the exposed "top" surface of the concrete causing a lubricating effect between the tool and the concrete. This lubricating effect allows the user to more easily slide the finishing tool across the concrete. The blade, which has an acoustic impedance which varies continuously between its opposing faces is manufactured by a "pultrusion" technique. "Pultrusion" is a process for manufacturing composite materials in which continuous fibers are pulled through a liquid thermoplastic or thermosetting resin in order to impregnate those fibers into the resin. Once the resin solidifies, the resulting composite material is significantly stronger than a similarly constructed material containing randomly oriented fibrous particles or a resin material containing no fibers at all. In addition, the density of the fibers in the composite material directly affects the acoustic impedance of the material.

Pultrusion may be used to produce a finished composite material which has a uniform acoustic impedance gradient across its cross-section. During the pultrusion process, a guide is used to position the fibers within the molten resin. In prior pultrusion materials, the fibers are typically evenly distributed throughout the resin by a guide which is manufactured with the guide holes distributed equidistance apart. A guide can alternatively be constructed such that fibers are more highly concentrated on one side of the finished composite material than on the other. For example, the fibers can be spaced apart a few micro-inches near the finished product's "top" side, while the fibers near the product's "bottom" side are more closely spaced. The spacing between fibers can, for example, gradually change to several hundreds of micro-inches in the finished product's "bottom" side.

In accordance with this invention, a composite material, which has a uniformly changing fiber density between two opposite surfaces, can be manufactured so as to match the respective acoustical impedances of any two dissimilar media with which the material's opposing surfaces may be in contact. When a sound wave travels from one medium to another, where the two media's acoustic impedances are not equal, a portion of the acoustical energy is reflected at the interface of the media, resulting in less than one hundred percent of the acoustical energy's being transmitted through the second medium. If the impedances of the two media were matched, a better energy transfer from the first medium to the second medium can be realized. For example, if a sound wave travelling from a first medium having a first impedance, $z_1$, to an adjacent second medium having a second impedance, $z_2$, where $z_1$ is not equal to $z_2$, a percentage of the sound wave's energy will be dissipated (i.e. reflected) at the interface of the two media due to the differences in their acoustic impedances. A more efficient transfer of acoustic energy from the first medium to the second medium can be accomplished by positioning a third medium between the first and second media, provided the third medium's acoustic impedance gradually changes from $z_1$ at its surface which is in contact with the first medium to $z_2$ at its surface which is in contact with the second medium. Pultrusion used in the manufacture of the preferred embodiment of the present invention to produce such an impedance matching "third" medium.

This method of manufacturing a continuous fiber-reinforced composite material also produces a strong finished product which may advantageously have relatively high tensile strength in areas of the material which correspond to areas of high fiber concentration.

Accordingly, another object of the present invention is to provide a liquid-filled piezoelectric transducer which efficiently imparts acoustic energy from a liquid immersed piezoelectric actuator within a transducer housing, though the transducer housing, and into a work medium.

It is a further object of the present invention to provide a device of the character described in which the housing comprises a work medium-engaging blade whose interior surface's acoustic impedance is matched to that of the liquid within the housing.

It is a further object of the present invention to provide a device of the character described in which the blade has a bottom (i.e. exterior) surface whose acoustic impedance is matched to that of the work medium into which the acoustic energy is to be imparted.

It is a further object of the present invention to provide a device of the character described in which the interior surface of the blade reflects virtually none of the acoustic energy generated by the piezoelectric actuator, but instead readily transmits such energy into an adjacent work medium.

It is another object of the present invention to provide a device of the character described which is at the same time compact, light in weight, and of an extremely simple and uncluttered design.

It is another object to provide an embodiment of the present invention which is adapted for use in finishing concrete structures that is effective in creating a smooth and wet top layer in plastic concrete for lubrication of the tool and a smooth finish of the concrete.

It is another object to provide a hand-operated modification of the present invention in which there is minimal vibration transmitted through the handle and to the operator relative to the amount of vibration which is transmitted through the blade of the device and into the concrete work medium.

It is another object of the present invention to provide a device of the character described in which the piezoelectric element(s) is (are) protected from damage within a sealed interior chamber filled with a liquid.

It is another object to provide a modification of the present invention which is battery powered.

It is another object of the present invention to provide a device of the character described which is of a modular design such that several of the devices can be connected so to create a larger working surface area.

It is another object of the present invention to provide a device of the character described in which the working area of the device can be increased or decreased, as desired, by adding or removing, respectively, transducer modules.

It is another object to provide a modification of the present invention which is adapted to transmit acoustic energy into work media for purposes of acoustically generating an image.

It is another object to provide a modification of the present invention comprising a liquid-immersed piezoelectric sensor enclosed within a transducer housing which is adapted to receive acoustic signals from outside of the housing.

It is another object to provide a modification of the present invention comprising a liquid-immersed piezo electric transmitter enclosed within a transducer housing which is adapted to transmit acoustic signals to a medium outside of the housing.

Further objects and advantages of this invention will become apparent from a consideration of the drawings and ensuing description thereof.

DESCRIPTION OF THE PREFERRED EMBODIMENTS

Figure 1:
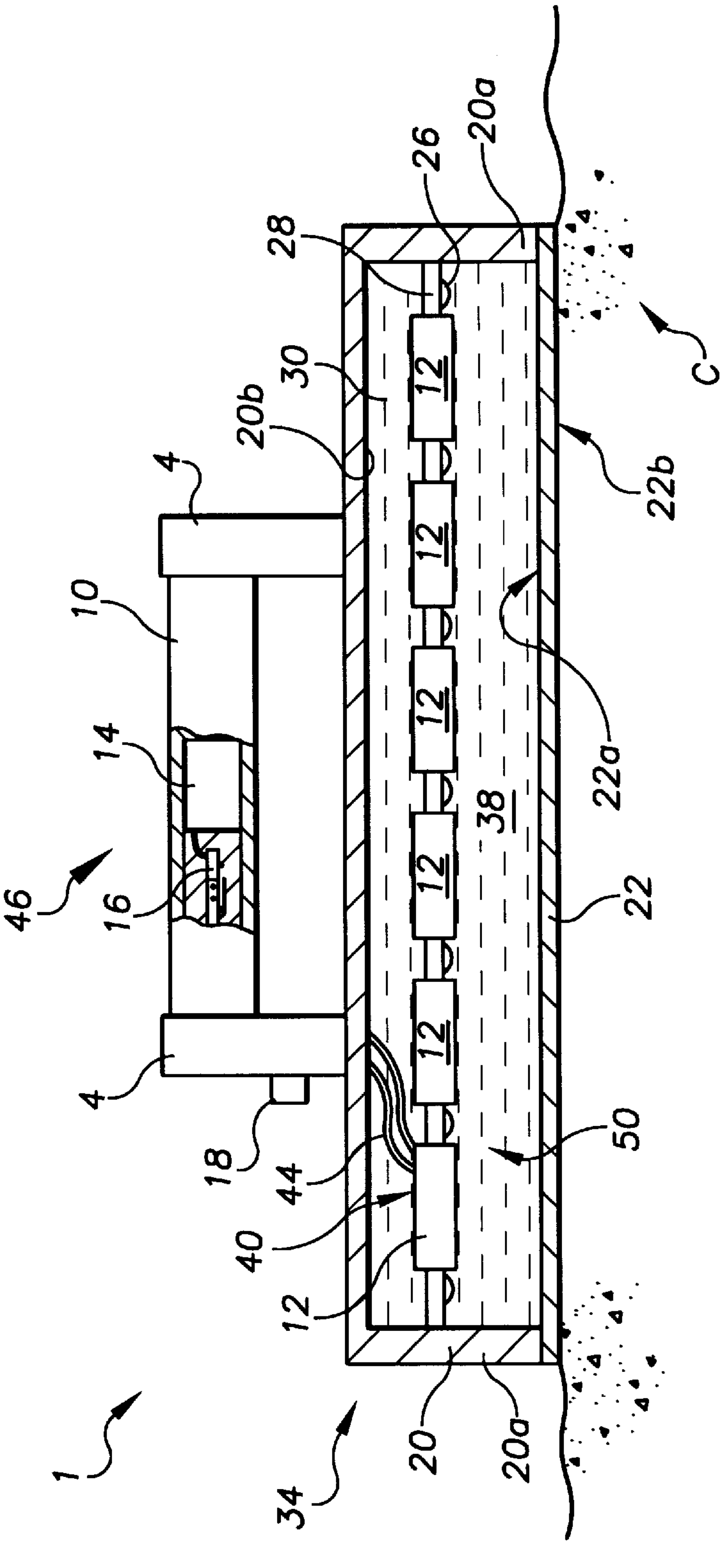
FIG. 1 is a cross-sectional elevational view showing a liquid-filled piezoelectric transducer constructed in accordance with the present invention.

With initial reference directed toward FIG. 1 of the appended drawings a liquid-filled piezoelectric transducer embodying the principles and concepts of the present invention and generally designated by the reference numeral 1 will be described.

As will be described more fully herein below, in the preferred embodiment of the present invention, a liquid-filled piezoelectric transducer 1 is arranged to efficiently impart acoustic energy from a liquid-immersed piezoelectric actuator 12 within a transducer housing 34, through a housing bottom member 22, and into a work medium such as plastic concrete C.

The housing bottom member 22 is preferably constructed such that its acoustic impedance at its interior surface 22*a* is matched to that of the liquid 38 within the housing 34, and its acoustic impedance at its exterior surface 22*b* is matched to that of the plastic concrete C work medium to which the acoustic energy is to be transmitted, and a continuous impedance gradient exists between the interior 22*a* and exterior 22*b* surfaces of the housing bottom member 22. As will be described more fully herein below, this construction allows efficient transmission of acoustic waves from the liquid 38 to the concrete C work medium with virtually no wave reflection losses.

Figure 2:
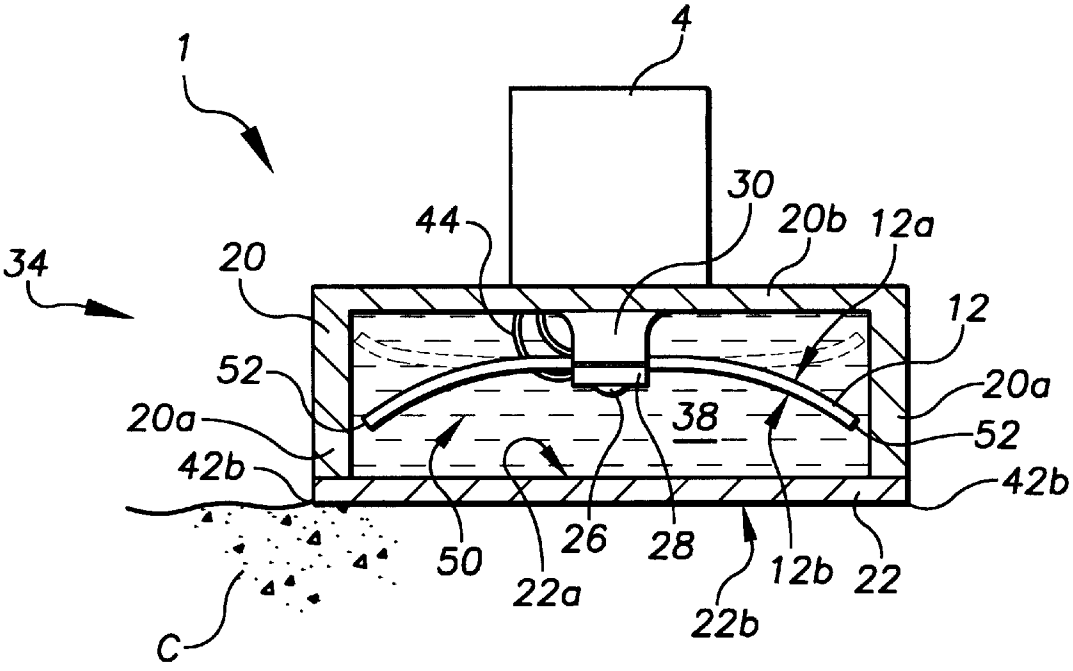
FIG. 2 is a cross-sectional end view of the transducer shown in FIG. 1.

In the preferred embodiment of the invention, the housing 34 comprises a casing 20 which is fabricated of a lightweight composite material. Running longitudinally along the top middle of the casing 20 is a rib 30. In the preferred embodiment of the invention the rib 30 is made of phenolic, however it may alternatively either be fabricated of another electrically insulating material such as acrylic or plastic, or of a conductive material such as a lightweight metal. This rib 30 is attached to the interior top surface 20*b* of the casing 20 by conventional bonding means such as gluing (not shown). In the preferred embodiment of the invention, attached to this rib 30 is a series of approximately six prestressed piezoelectric actuators 12. However, in modified embodiments of the invention there may be as few as one piezoelectric actuator 12 attached to the rib 30. The actuator elements 12 are preferably aligned along the rib 30 in an equally spaced manner. Each actuator 12 straddles, and is secured to, the rib 30 with the normally concave face 12*b* of the actuator 12 directed downward (i.e. toward the housing bottom member 22), as illustrated in FIG. 2. In a modification of the invention the actuator elements 12 may be secured to the rib 30 with their normally concave faces 12*b* directed upward. Preferably, each actuator element 12 is placed in a recess or notch 40 in the rib 30. The actuator elements 12 are held in place by a bar 28 which, in the preferred embodiment of the invention, is approximately the same length and width of the rib 30. The bar 28 is positioned adjacent the actuators 12 and secured to the rib 30 with screws 26 at tapped holes 27 between the actuator elements 12. The bar 28 is preferably made of an electrically insulating material.

Figure 3:
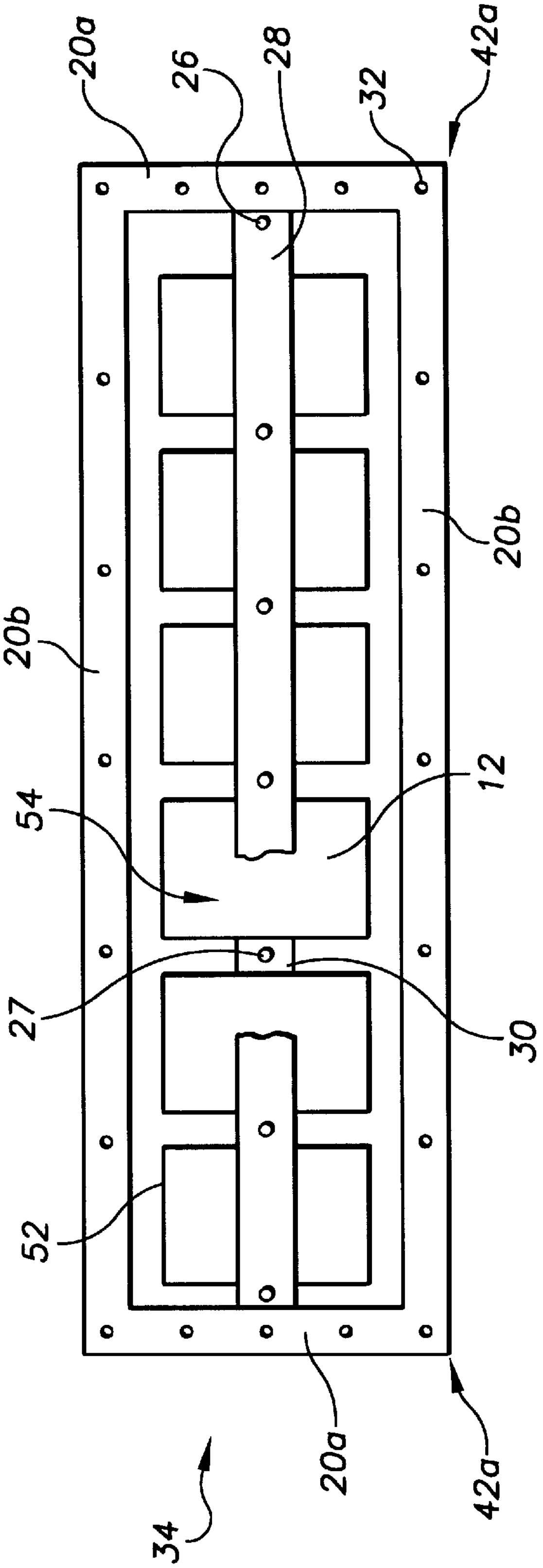
FIG. 3 is a plan view of the bottom of the piezoelectric transducer, with the bottom member removed to show the interior cavity.
Figure 5:
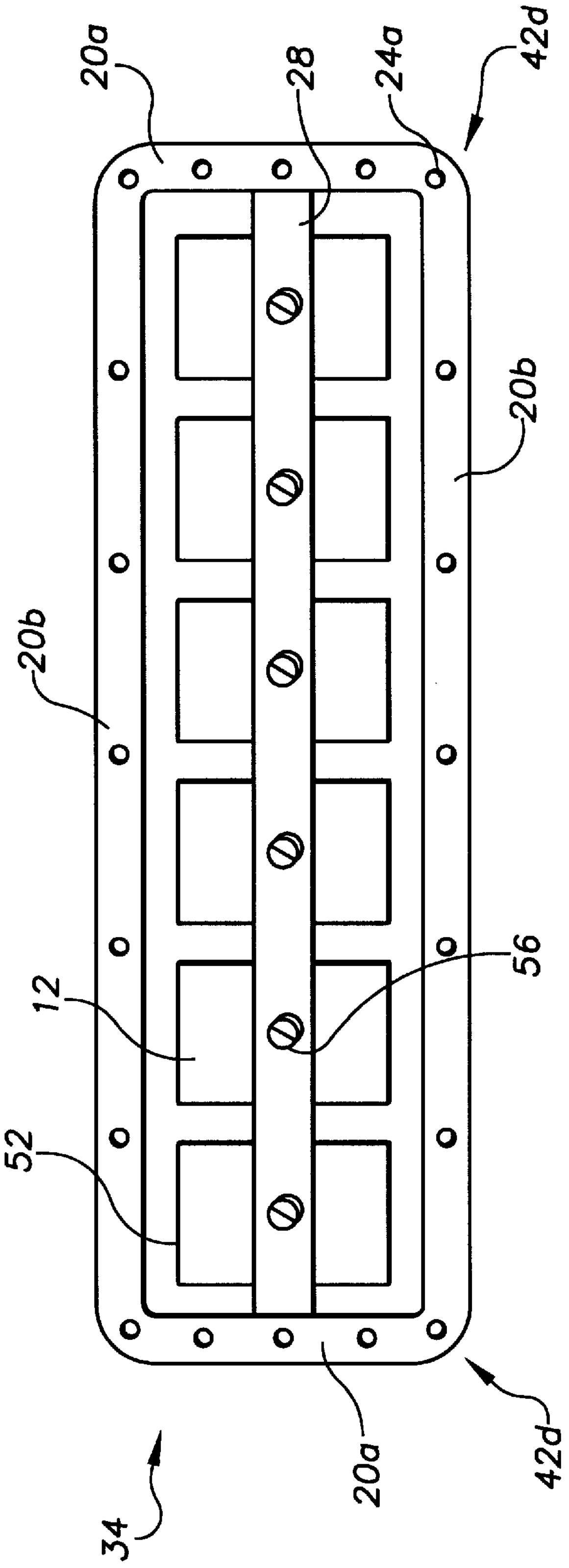
FIG. 5 is a plan view of the bottom of a modification of the present invention, with the bottom blade removed to show the interior cavity.
Figure 6:
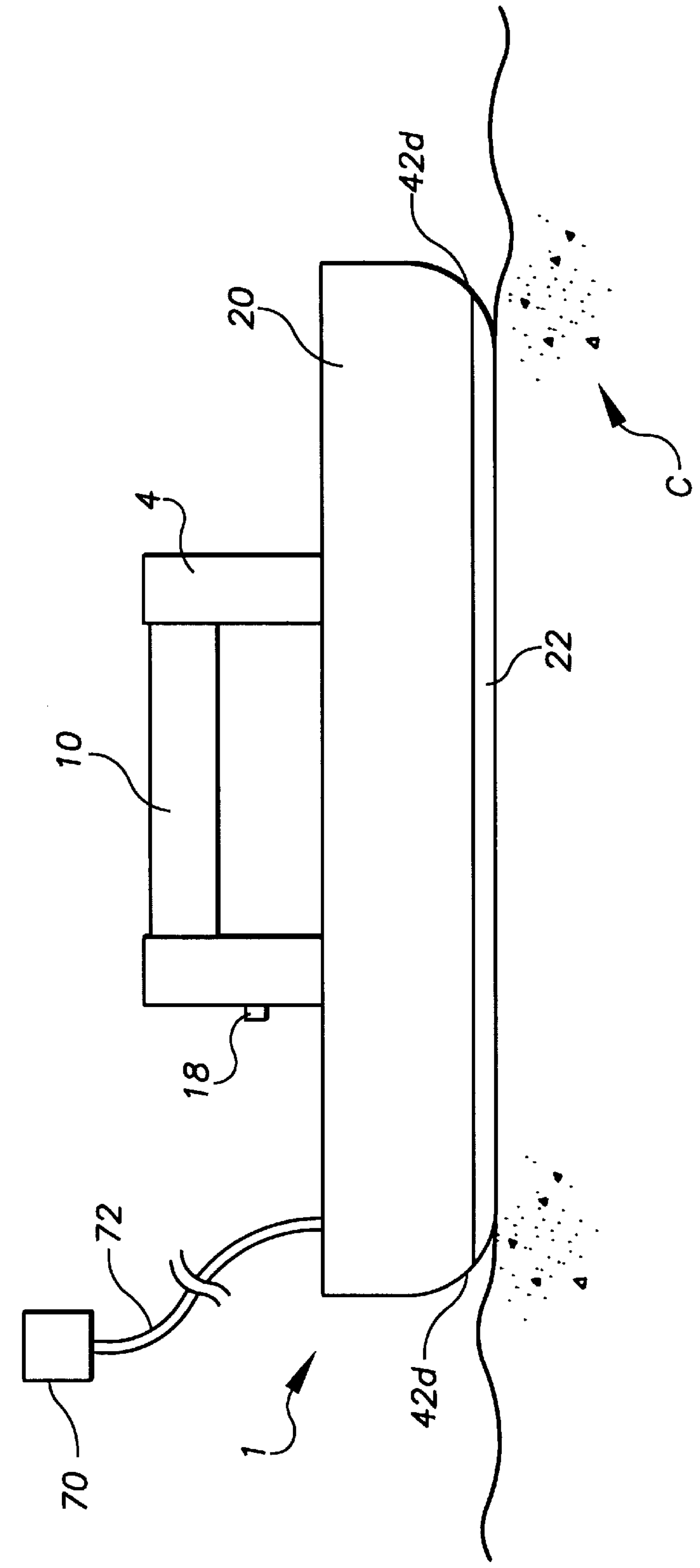
FIG. 6 is a side elevation of the modified liquid-filled vibrator shown in FIG. 5.

Preferably, the transducer 1 is constructed such that housing 34 has square vertical and horizontal corners 42*a* and 42*b* (as illustrated in FIG. 2 and FIG. 3) so that the transducer 1 may be easily used on work surfaces having tight corners. However, in a modified embodiment of the invention, housing 34 may alternatively have rounded horizontal and vertical corners 42*c* and 42*d*, respectively (as shown in FIG. 5 and FIG. 6) to allow the transducer 1 to be easily moved over a plastic concrete C work surface and prevent buildup of water and slurried concrete in front of the moving transducer 1 as it moves over the surface of the plastic concrete C.

The casing 20 is preferably constructed of a rigid material which has a significantly different acoustic impedance from that of the liquid 38 inside of the housing 34. This impedance difference helps reflect the acoustic waves inside the liquid-filled housing 34. It will be appreciated that the rigidness of the casing 20, and the acoustic impedance difference between the casing 20 and the liquid 38, prevent acoustic waves generated by the actuators 12 within the liquid-filled housing 34 from being transmitted into the casing 20 and, subsequently, into the handle 10 and the operator's hand.

The handle 10 is secured in place by handle supports 4 which are attached to the top of the casing 20 by a conventional method such as gluing, welding, threaded fasteners (not shown), or the like. Housed within the handle 10 is a battery 14 and electric control circuitry 16. In a modification of the present invention the battery 14 is contained in a small, compact battery pack 70 which may be worn on a belt around the operator's waist, and is connected to the control circuitry 16 by a cord 72 (as illustrated in FIG. 6).

Figure 8:
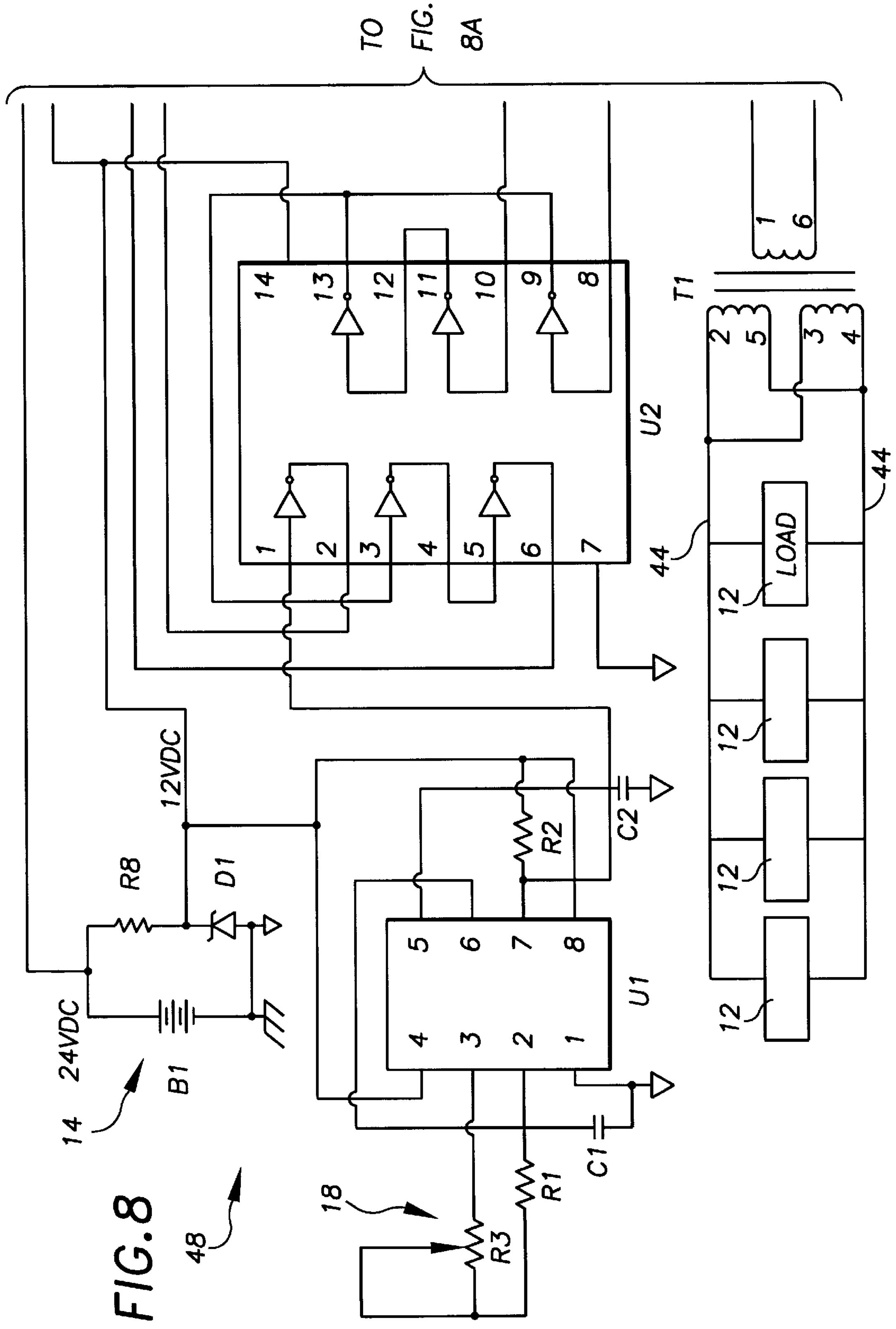
FIG. 8 is a schematic diagram of the electrical control circuitry of the preferred embodiment of the present invention; and, FIG. 9 is an isometric view of a pultrusion guide used in the manufacture of the present invention.
Figure 8A:
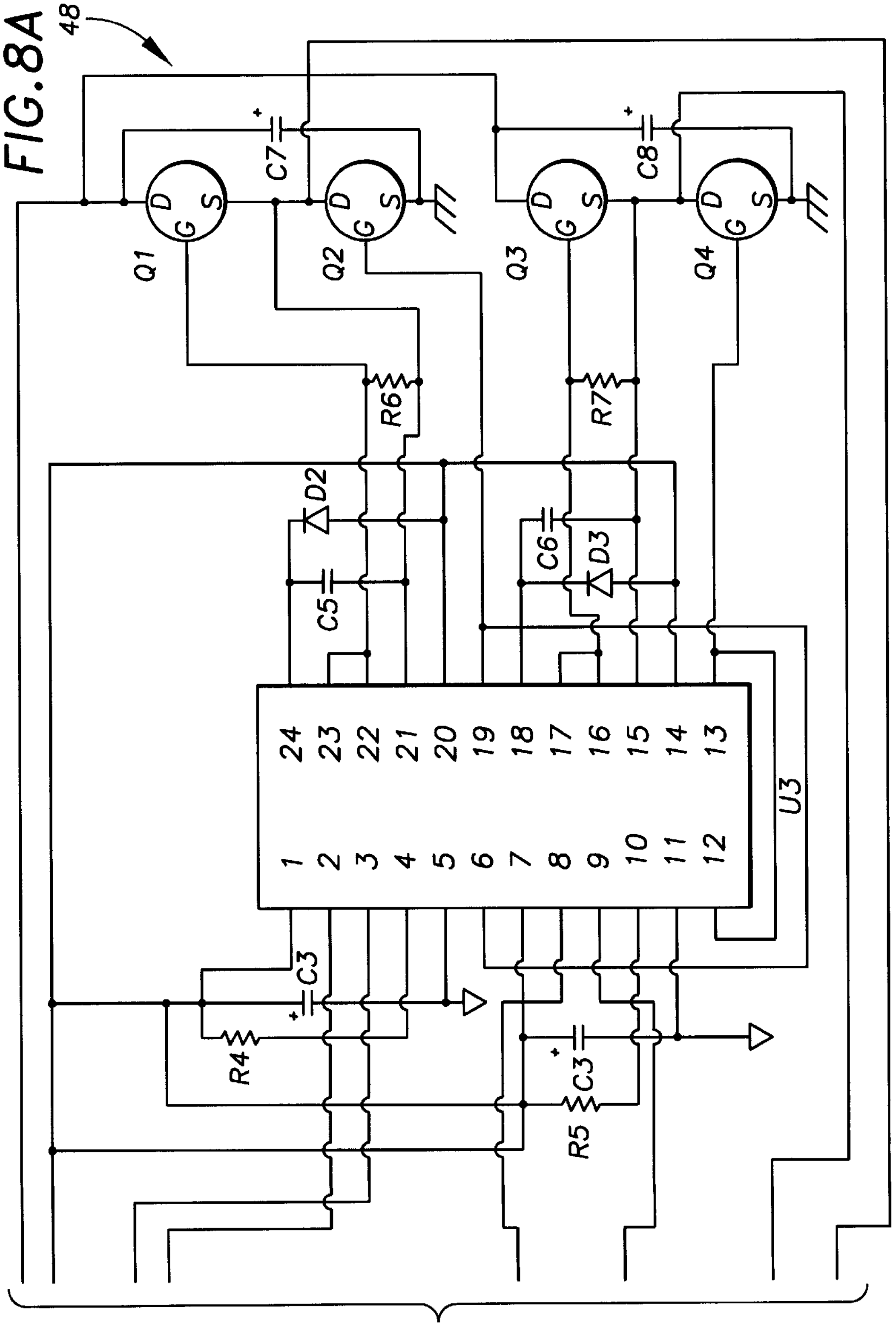

The control circuitry 16 preferably comprises a regenerative electric circuit 48, such as illustrated in FIG. 8. As will be explained more fully below, the regenerative electric circuit 48 optimizes the electrical-to-mechanical energy conversion efficiency of each actuator 12 by supplementing electric power supplied to the device from the batteries 14 with piezoelectrically generated electricity produced by the mechanical deformation of the actuator 12.

Figure 7:
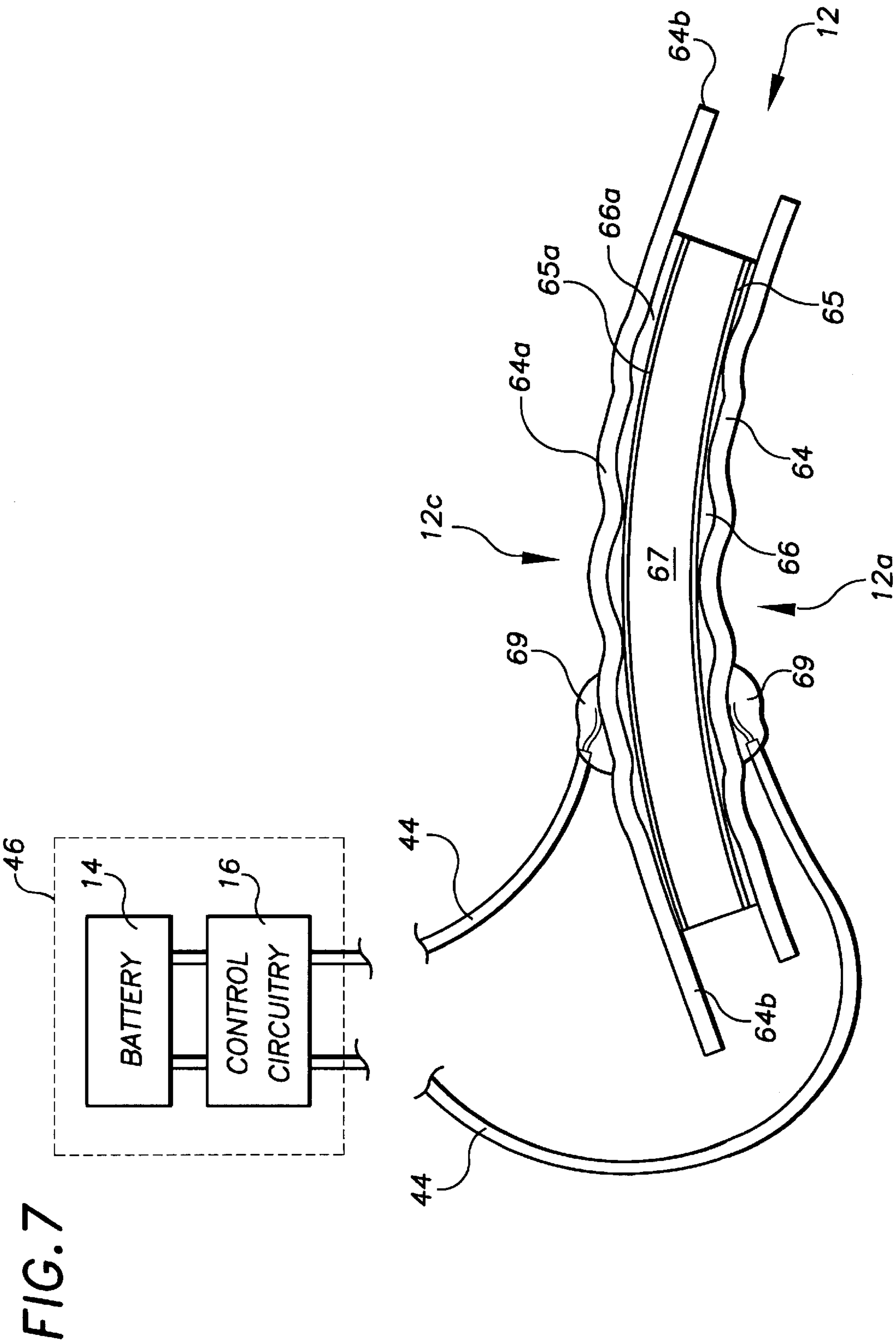
FIG. 7 is a side elevation of an actuator element used in the preferred embodiment of the present invention, showing details of construction of an actuator element.

Each actuator 12 is electrically connected to the control circuitry 16 by wires 44 attached to the actuator's electrodes 65, as illustrated in FIGS. 7 & 8. Electricity may be provided to each actuator 12 by parallel wires 44 attached to corresponding electrodes 65 (as illustrated in FIG. 8), or the various actuator elements 12 may alternatively be electrically connected in series. In a modification of the invention, the top of the rib 30 and the bar 28 may each be made of a conductive material to which only a single pair of wires 44 are attached. In this modification of the invention the rib 30 and bar 28 each function as an electrical bus, obviating the attachment of wires 44 to each actuator element 12 individually. This modification requires fewer wires than does the preferred embodiment of the invention.

Preferably located on one of the handle supports 4, is a multi-position switch 18. The character of the current transmitted to the actuator elements 12 is controlled by this switch 18. In addition to turning the device on and off, the multi-position switch 18 is used to vary the frequency of the electrical signal to the actuator elements 12 (and, correspondingly, the frequency at which the actuator 12 vibrates). In the preferred embodiment of the invention the multi-position switch 18 has settings corresponding to output frequencies of approximately 100 Hertz, approximately 200 Hertz, and a frequency preferably corresponding to the natural resonant frequency of the medium to which the acoustic waves are to be transmitted (e.g. the plastic concrete work medium C directly beneath the device 1).

Disposed within the casing 20 is an oil 38 through which the acoustic waves generated by the actuator elements 12 propagate. The oil 38 is preferably a lightweight electrically insulating oil such as peanut oil or transformer oil. It will be appreciated by those skilled in the art that these types of oil are conducive to efficient sound wave transmission. In a modification of the present invention alternative fluids, including water, may be used in place of oil 38.

The bottom member 22 has a series of screws 24 around its perimeter which secure it to the housing 34 via holes 32 (as illustrated in FIG. 3).

As will be more fully described below, in the preferred embodiment of the invention the bottom member 22 of the transducer 1 is manufactured by a process known as "pultrusion". Pultrusion is a method of manufacturing composite materials wherein continuous fibers are pulled though holes in a guide and embedded in an initially molten resin material. As the resin cools it begins to solidify and is drawn, along with the pulled fibers, through and extrusion die. The fibers and resin are drawn through the extrusion die at the same speed, such that there is no relative motion between the resin material and the fibers. It will be understood that this process produces a composite material in which the fiber-resin matrix (and, therefore, the fiber density across the cross-section of the material) substantially corresponds to the hole matrix in the pultrusion guide.

Figure 9:
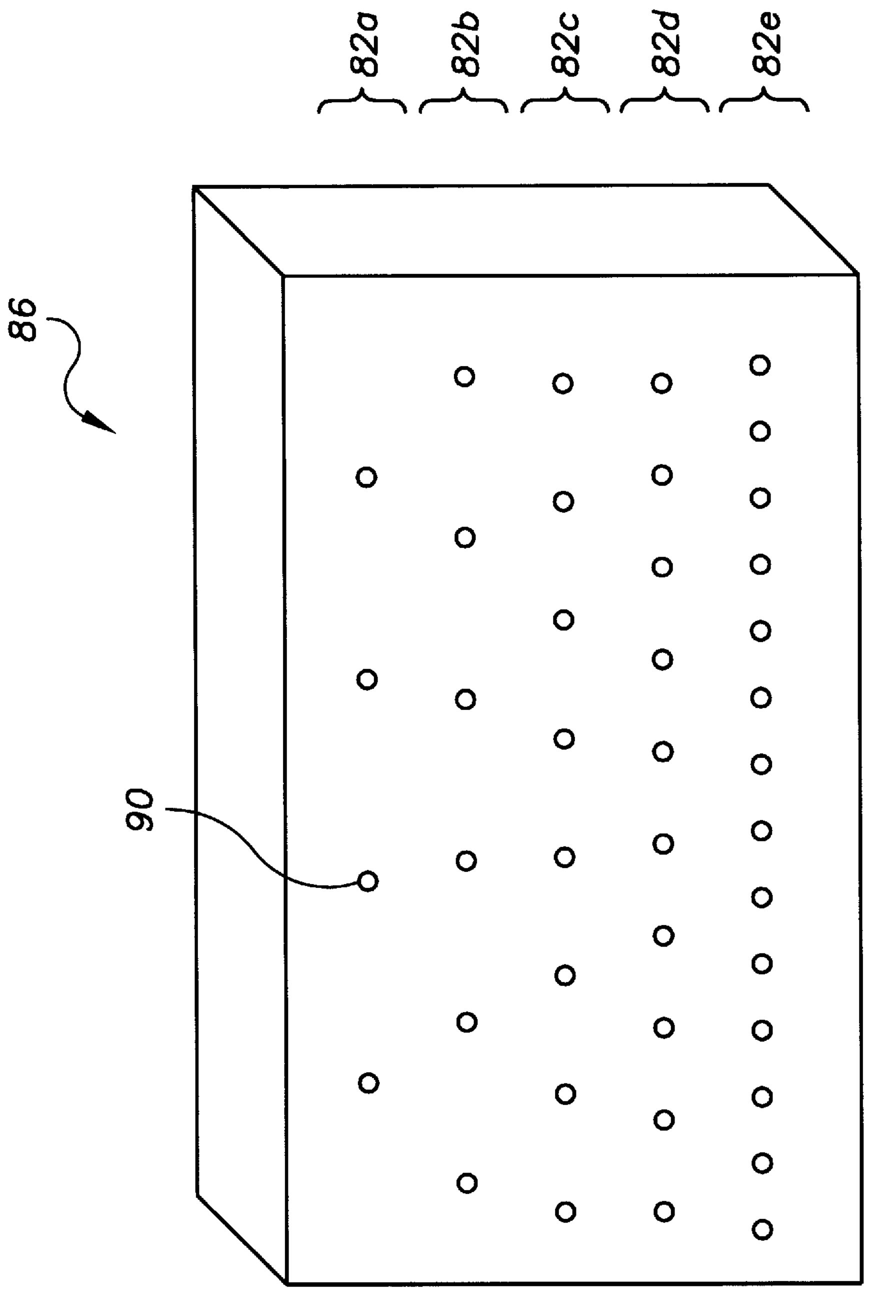

FIG. 9 depicts a pultrusion guide 86 which may be used in the manufacture of the present invention in order to produce a composite material (namely the bottom member 22) having an array of continuous fibers in which the fiber density in the material uniformly varies over the material's thickness. It should be noted that the shape of the perimeter of the guide 86 may be square, circular, elliptical or any other geometric pattern necessary to mate with the pultrusion manufacturing machinery used. By way of example, the pultrusion guide 86 illustrated in FIG. 9 has five horizontal rows 82*a*–82*e* of holes 90. The various rows 82 of holes 90 are preferably spaced equidistance apart, and each hole 90 in any given row 82 is preferably spaced equidistance from the hole(s) next to it. The spacing of holes 90 in each row 82 continuously varies from the top row 82*a* to the bottom row 82*e*. In the example illustrated in FIG. 9 the spacing of holes 90 in any given row 82 is less than the spacing of holes 90 in the rows above it. It will be understood that a pultrusion guide 86 having the above described characteristics may be used in a pultrusion process to produce a composite material comprising a fiber-resin matrix wherein the fiber density across the cross-section of the material substantially corresponds to the hole pattern matrix in the pultrusion guide 86. Thus, in this manner a composite material may be produced in which the density of fibers in the material continuously varies between two opposing surfaces of the material.

In the preferred embodiment of the invention the bottom member 22 is constructed of a composite material comprising a fiber matrix in which the fiber density varies continuously between the interior surface 22*a* and the exterior surface 22*b* of the bottom member 22. The density of each fiber, per se, in the material is different from the density of the rest of the material (i.e. the resin). It will be understood that the acoustic impedance of any material depends, in part, upon the density of the material. It will also be understood that the density of a composite material may be changed by varying the fiber concentration density in the material. Accordingly, it will be appreciated that by continuously varying the fiber concentration density between opposite faces (22*a* and 22*b*) of the bottom member 22, a uniform acoustic impedance gradient may be established between the interior surface 22*a* and the exterior surface 22*b* of the bottom member 22. It will also be appreciated that particular fiber matrix density values may be advantageously selected to produce acoustic impedance values in the composite material matching predetermined acoustic impedance values.

In the preferred embodiment of the invention the acoustic impedance at the interior surface 22*a* of the bottom member matches the impedance of the liquid 38; and the acoustic impedance at the exterior surface 22*b* of the bottom member matches the acoustic impedance of the plastic concrete work medium C; and the acoustic impedance between the two surfaces (22*a* and 22*b*) continuously (i.e. smoothly and non-abruptly) varies between the two.

Referring now to FIG. 7: The actuator 12 used in the preferred construction of the present invention is a flextensional piezoelectric transducer. Various constructions of flextensional piezoelectric transducers may be used (including, for example, "moonies", "rainbows", and other unimorph, bimorph, multimorph or monomorph devices, as disclosed in U.S. Pat. No. 5,471,721), but the actuator element 12 preferably comprises a Thermally Prestressed Piezoelectric ("TPP") actuator constructed in accordance with the following description.

Each TPP actuator 12 is a composite structure such as is illustrated in FIG. 7. Each TPP actuator 12 is preferably constructed with a PZT piezoelectric ceramic layer 67 which is electroplated 65 on its two major opposing faces. A steel, stainless steel, beryllium alloy or other metal first pre-stress layer 64 is adhered to the electroplated 65 surface on one side of the ceramic layer 67 by a first adhesive layer 66. The first adhesive layer 66 is preferably LaRC™-SI material, as developed by NASA-Langley Research Center and disclosed in U.S. Pat. No. 5,639,850. A second adhesive layer 66*a*, also preferably comprising LaRC™-SI material, is adhered to the opposite side of the ceramic layer 67. During manufacture of the TPP actuator 12 the ceramic layer 67, the adhesive layers 66 and 66*a* and the first pre-stress layer 64 are simultaneously heated to a temperature above the melting point of the adhesive material, and then subsequently allowed to cool, thereby re-solidifying and setting the adhesive layers 66 and 66*a*. During the cooling process the ceramic layer 67 becomes compressively stressed, due to the higher coefficient of thermal contraction of the material of the pre-stress layer 64 than for the material of the ceramic layer 67. Also, due to the greater thermal contraction of the laminate materials (e.g. the first pre-stress layer 64 and the first adhesive layer 66) on one side of the ceramic layer 67 relative to the thermal contraction of the laminate material(s) (e.g. the second adhesive layer 66*a*) on the other side of the ceramic layer 67, the ceramic layer deforms in an arcuate shape having a normally concave face 12*a* and a normally convex face 12*c*, as illustrated in FIG. 7. One or more additional pre-stressing layer(s) 64*a* may be similarly adhered to either or both sides of the ceramic layer 67 in order, for example, to increase the stress in the ceramic layer 67 or to strengthen the actuator 12.

Electrical energy may be introduced to the TPP actuator 12 from an electric power supply (e.g. battery 14) and control circuitry 16 by a pair of electrical wires 44 attached to opposite sides of the TPP actuator 12 in communication with the electroplated 65 and 65*a* faces of the ceramic layer 67. As discussed above, the pre-stress layers 64 and 64*a* are preferably adhered to the ceramic layer 67 by LaRC™-SI material. The wires may be connected (for example by adhesive or solder 69) directly to the electroplated 65 and 65*a* faces of the ceramic layer 67, or they may alternatively be connected to the pre-stress layers 64 and 64*a*. LaRC™-SI is a dielectric. When the wires 44 are connected to the pre-stress layers 64 and 64*a*, it is desirable to roughen a face of each pre-stress layer 64 and 64*a*, so that the pre-stress layers 64 and 64*a* intermittently penetrate the respective adhesive layers 66 and 66*a*, and make electrical contact with the respective electroplated 65 and 65*a* faces of the ceramic layer 67.

It will be appreciated by those skilled in the art that by using an actuator element 12 comprising a pre-stressed piezoelectric element (e.g. TPP element) the strength, durability, and piezoelectric deformation (i.e. output) are each greater than would normally be available from a comparable piezoelectric element which is not pre-stressed. Accordingly, in the preferred embodiment of the invention it is desirable to employ actuator elements 12 comprising pre-stressed piezoelectric elements; however, non-pre-stressed piezoelectric elements may alternatively be used in modified embodiments of the present invention.

Referring now to FIGS. 1–3: By way of example only, each TPP actuator 12 may be approximately 1.4" wide×2.0" long, and between 0.005" and 0.030" thick. The TPP actuators 12 may be spaced approximately 0.5" apart and are sealed within the casing's interior cavity 50, which is full of a liquid 38 such as oil. The spacing of the TPP actuators 12 across the length of the interior cavity 50 provides uniform distribution of vibrational energy over the length of the device.

Referring now to FIG. 8: The preferred embodiment of the invention comprises an electric circuit 48 in which the amount of electrical energy required to generate the desired mechanical vibrations are minimized, piezoelectrically generated electrically energy is recovered, the actuator elements 12 are prevented from over-heating, and the electrical-to-mechanical energy conversion efficiency of the actuator elements are maximized. An explanation of operation of this preferred electrical circuit 48 follows: Active loads are loads which are capable of returning energy into the output of the source driving the load. A piezoelectric transducer is an example of an active load. A piezoelectric transducer produces a potential difference (voltage) across itself when forced to expand or contract. Piezoelectric transducers have elements of resistance, capacitance, and inductance. Since both capacitors and inductors are energy storage devices, some of the energy driving a piezoelectric transducer is inherently stored within the transducer.

Voltage is stored within the capacitive element of piezoelectric transducers. During high frequency oscillation of a piezoelectric element, this stored source voltage may add to the piezoelectrically generated voltage produced by deformation of the piezoelectric element, thus producing stored voltages which may incrementally increase with each oscillation of the piezoelectric element and thereby render such a system unstable. This elevated voltage may be dissipated either by returning energy to the source or internally dissipating electrical energy across the resistive element of the transducer. Prior art includes a circuit which dissipates the elevated voltage when it exceeds a threshold by dropping the voltage across a Zener diode, making an inefficient use of the stored energy.

The elevated voltage creates problems when active loads are driven for even short periods of time (i.e. a few minutes). For example, as piezoelectric transducers are driven, the stored voltage increases with each successive expansion or contraction of the piezoelectric transducer. Eventually, the voltage either exceeds the source's capability to absorb the excess voltage, causing source failure, or the dielectric constant of the piezoelectric transducer is exceeded, resulting in the "arcing" and eventual "shorting" of the transducer. Excessive heat is also generated within the transducer as a result of this elevated voltage being dissipated across the resistive element within the piezoelectric transducer.

The preferred embodiment of the present invention comprises a regenerative driver circuit 48 as illustrated in FIG. 8. The piezoelectrically generated electrical energy is captured, stored, and returned to the source voltage in a manner such that very little energy is necessary to expand (or contract) the transducer (e.g. actuator element 12). This circuit reduces the internal heat of the piezoelectric transducer (e.g. actuator element 12) by removing both the generated and stored potential differences of the piezoelectric transducer. Cooling the transducer in this manner yields a higher electrical-to-mechanical conversion efficiency of the actuator element 12 itself, thus lowering the amount of power necessary to drive the load. The circuit also increases the life of the power supply by regulating energy returned to it.

A battery B1 (14) supplies 24 VDC to the driver circuit 48. A resistor R8 drops the source voltage to 12 VDC so that it can be used by integrated circuit chips U1, U2, and U3. Chip U1 is a CMOS timer chip which converts the direct current source voltage from battery B1 into a square wave. The frequency of the square wave produced by U1 may be varied by changing the value of the potentiometer R3. The square wave output from U1 is connected to the inputs of several Schmitt triggered inverters located in chip U2. These inverters have faster switching capabilities than regular inverters, thus peak rise times are faster resulting in a more square wave output. Schmitt inverters also reduce noise chattering at high frequencies.

Chip U2 produces two output signals. One signal is the inverse of the other. These two signal outputs, from pins 2, 6, 8, and 10 on chip U2, are connected to driver input pins 2, 3, 9, and 8 on the driver chip U3, respectively. The U3 chip controls the switching of four Metal Oxide Semiconductor Field Effect Transistors (MOSFETs), Q1–Q4. Driver input pins 2 and 9 are provided with inverted signals, while driver input pins 3 and 8 are provided with uninverted signals, thus creating a switching sequence which turns Q1 and Q2 "off" while Q3 and Q4 are "on", respectively. The switching sequence allows current from the battery to be alternated within the transformer. The alternating current is then "stepped up" to the "operating voltage" of the load using a transformer, T1. In this embodiment, T1 is a 4.1:1 ratio transformer, which steps the 24 volts provided by the battery B1 to 200 volts peak to peak. The "operating voltage" is simply the amount of voltage necessary to deform the load (piezoelectric actuator element 12).

The MOSFETs, Q1–Q4, help provide the regenerative capability of the circuit. Their switching sequence allows the load to dissipate energy by reversing the process discussed in the previous paragraph. Voltage stored within the load is "stepped down" and returned to the battery B1, resulting in an efficient use of energy stored and produced by the load (e.g. actuator element 12).

In operation, the transducer may be placed adjacent a work medium, such as plastic concrete mass C. An alternating electric current is applied to each of the actuators 12 via electric wires 44 connected to the power supply 46. Each actuator 12 vibrates at a frequency corresponding to the frequency of the applied current. Preferably, the current is applied from a battery 14 housed inside of the handle 10. The character of the current transmitted to the actuators 12 is controlled by a multi-position switch 18 which may be physically located on the handle 4, as illustrated in FIG. 1.

When energized by an alternating current in the manner described above, the actuators 12 vibrate in a "wing-flapping" manner (as indicated by dashed lines in FIG. 2). The ends 52 of the actuators 12 vibrate up-and-down in a substantially vertical direction while the centers 54 of the actuators 12 remain substantially stationary against the longitudinal rib 30. The vibrational energy from this "wing flapping" motion of the actuators 12 generates acoustic waves which propagate through the oil 38. Acoustic waves in the oil 38 which encounter either the interior top surface 20*b* or the sides 20*a* of the casing 20 are reflected back into the oil 38, due to the difference in acoustic impedance of the oil 38 and the casing 20 at the oil/casing interface. However, acoustic waves in the oil 38 which encounter the interior surface 22*a* of the bottom member 22 are not reflected back into the oil 38 because the acoustic impedance of the oil 38 and the interior surface 22*a* of the bottom member 22 are substantially equal. Instead, acoustic waves from the oil 38 which encounter the interior surface 22*a* of the bottom member 22 are transmitted into and through the bottom member 22 towards its exterior surface 22*b*. Because there is a continuous (i.e. non-abrupt, smooth) acoustic impedance gradient between the bottom member's interior surface 22*a* and exterior surface 22*b*, the vast majority of acoustic entering the bottom member 22 is transmitted directly through the bottom member 22 without being reflected or otherwise dissipated by the bottom member 22. Similarly, because the acoustic impedance at the exterior surface 22*b* of the bottom member is selected to be the same (or nearly the same) as the acoustic impedance of the plastic concrete C work medium with which the bottom member is engaged, when acoustic waves within the bottom member 22 reach the bottom member's exterior surface 22*b*, the acoustic energy is nearly completely transmitted to the plastic concrete C work medium.

For illustrative purposes, the magnitude of the "wing-flapping" motion of the ends of the actuators 12 (indicated by dashed lines in FIG. 2) is drawn exaggerated in FIG. 2. In actuality, the displacement of the ends 52 of the actuators may be very small, typically on the order of a micrometer or less. In order to ensure optimal acoustic energy transmission efficiency the interior cavity 50 is completely filled with liquid 38.

It will be understood then that for a transducer 1 constructed in accordance with the present invention, wherein the exterior surface 22*b* of the bottom of the tool is engaged with a work medium (e.g. plastic concrete C) whose acoustic impedance matches the acoustic impedance of exterior surface 22*b* of the bottom of the tool, virtually all of the acoustic waves generated within the tool's interior cavity 50 are propagated through the tool's bottom member 22 and into the work medium. It will also be understood that, because of these characteristics, almost no vibrational energy is transmitted into the tool's handle 10 (and into the operator's hands), thus making the tool very easy and comfortable to use.

In use, the tool is pulled by its handle 10 across the top of a plastic concrete work medium C. Water, air and fines near the surface of the concrete are forced to the top by the acoustical energy imparted to the medium through the bottom 22 of the tool. The water accumulates on the surface of the plastic concrete mass and creates a lubricant for the tool, making it easier to move the tool across the surface of the plastic concrete than would be possible with a conventional (i.e. non-vibrating) hand tool. The fines and water which accumulate at the surface of the concrete create a slurry which is highly desirable for producing a smooth finished surface.

As will be appreciated by those skilled in the art, because there is virtually no horizontal displacement or deformation of the sides 20*a* of the tool, and because the tool is relatively small and light-weight, it is very easy to handle and is useful for working near edges and corners. As a result of these characteristics, less manual work is needed by the operator to finish the concrete work medium C than would be required using conventional manual concrete finishing tools.

It will be understood from the foregoing disclosure that the actuator elements 12 used in the present invention are very lightweight and are comprised of very few parts. Therefore, maintenance requirements are minimal. These characteristics are advantageous when compared to the bulk and intricacy of the motors, solenoids, etc., that are used in other common electrically-powered finishing tools.

As can be seen by review of the above description, the invention disclosed provides a vibrating hand tool which is compact, lightweight and easy to use. The simplicity of the design provides for ease of maintenance and long-life. The invention also efficiently imparts a high amount of energy into the work medium while minimizing the vibrational energy dissipated through the handle and into the operator's hand. In the preferred embodiment of the invention, the device is battery operated and the frequency of the vibrations are readily adjustable. It will be understood from the foregoing description that when a hand-tool constructed in accordance with the present invention is pulled (or "wiped") across the surface of a plastic concrete mass it produces a water/fine slurry at the surface. The slurry so-produced lubricates the blade/concrete interface. As a result of the slurry and the lubrication a smooth surface finish is created without necessitating a back and forth wiping motion.

Figure 4:
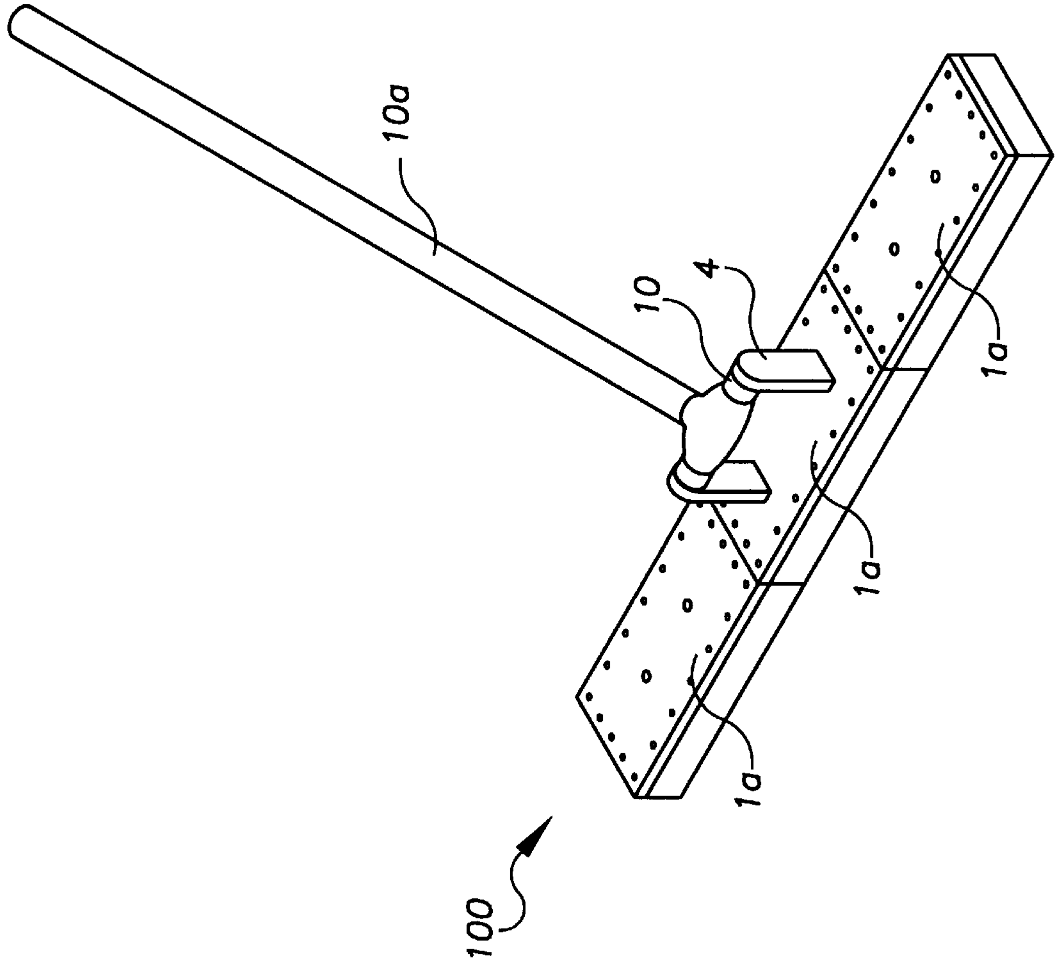
FIG. 4 is an isometric view of a multi-module vibrating tool.

Referring now to FIG. 4: In various modifications of the present invention, two or more vibrating tools constructed substantially as described herein above may be used as individual "modules" 1*a*, which may be assembled together to compose a larger, multi-module tool. An example of such a multi-module vibrating tool 100 is illustrated in FIG. 4. In the multi-module tool 100 shown in FIG. 4, three individual vibrating modules 1*a* (each constructed substantially in accordance with the preceding description of the preferred embodiment of the present invention) are attached to one another end-to-end. Adjacent vibrating modules 1*a* may be secured to each other by threaded fasteners (not shown) or by similar fastening means; or the vibrating modules may alternatively be secured to a common chassis or frame (not shown). In the multi-module vibrating tool 100 illustrated in FIG. 4, the handles which are used in the preferred embodiment of the invention have been removed from the two outboard modules la, and an elongated handle 10*a* has been attached to the center module. Electrical power to the individual modules 1*a* may be provided by a common power supply located either inside of the elongated handle 10*a*, inside of the center handle 10, on an operator-worn belt, or elsewhere. Alternatively, each individual module 1*a* may be provided with its own individual power supply, as described above with respect to the preferred embodiment of the invention.

It will be appreciated that a multi-module tool constructed in accordance with the foregoing description can be advantageously operated in substantially the same manner as the preferred embodiment of the invention, by an operator in a standing position, and that such a tool may be advantageously used to finish remote, or difficult to reach areas, without requiring that the operator stand or kneel in the wet concrete.

Although FIG. 4 illustrates a multi-module vibrating tool 100 having three vibrating modules 1*a* arranged end-to-end, it will be understood that any number of vibrating modules 1*a* may be used, and that the modules may be oriented side-to-side, or staggered, or in other configurations. Also, although it is preferable that the various modules 1*a* of a multi-module vibrating tool 100 be of similar size and construction and that each vibrate at the same frequency, it is within the scope of the present invention to construct multi-module vibrating tools 100 in which the various modules 1*a* are of different sizes and which vibrate at different frequencies.

It will be understood from the foregoing disclosure that a tool 1 constructed in accordance with the present invention provides a liquid-immersed piezoelectric actuator 12 which develops acoustic waves which efficiently propagate through the liquid and thence through a substantially "acoustically transparent" housing wall (i.e. bottom member 22) and into an adjacent target medium (i.e. the plastic concrete work medium C). The efficiency of the acoustic energy transmission from the actuator to the target medium is enhanced, in accordance with the present invention, by providing an intermediate structure (i.e. bottom member 22), between the liquid 38 in which the actuator 12 is immersed and the target medium (i.e. the plastic concrete mass C), having acoustic impedances at its two major surfaces matching the respective acoustic impedances of the interfacing media and a continuous acoustic impedance gradient between those two surfaces.

While the preceding disclosure describes the application of the preferred embodiment of the invention to advantageously generate and transmit acoustic waves into a plastic concrete work mass in order to develop a smooth surface finish on the concrete mass, it will be appreciated by those skilled in the art that the present invention can be advantageously used in many different applications and in many different arts to efficiently generate and transmit acoustic waves into target media. By way of example, a transducer constructed in accordance with the present invention is particularly well adapted to efficiently transmit acoustic signals into media for the purpose of creating acoustic images of the cross-section of the target media or for communication purposes. Such applications of the present invention would include, but not be limited to, SONAR transmitters/receiver and medical imaging transducers.

In medical applications such as ultrasonic imaging, for example, the "acoustically transparent" bottom member 22 of the tool may be constructed so that the acoustic impedance of the exterior surface 22*b* of the bottom member 22 matches the acoustic impedance of human tissue (not shown). In these (i.e. medical) applications of the present invention, the acoustic waves are efficiently transferred through the bottom member 22 of the tool and into the human tissue.

The preceding disclosure of the present invention describes its application essentially as an acoustic energy "transmitting" device. That is: The piezoelectric actuator 12 oscillates, which generates acoustic waves in the liquid 38 inside of the casing 20 which efficiently emit from the bottom member 22 of the tool and into a work medium. It will be understood, however, that acoustic waves may travel just as efficiently from the work medium into the interior cavity 50 of tool as from the interior cavity 50 to the work medium. It will be appreciated that in the former case the tool works as a "receiver"; and in the latter case the tool works as a "transmitter". In the "receiver" mode acoustic waves in the work medium adjacent to the exterior surface 22*b* of the tool propagate through the bottom member 22, thence from the bottom member 22 into the liquid 38 in the tool's interior cavity 50, and impact the piezoelectric "actuator" 12 element. In the "receiver" mode, the acoustic waves impose forces upon the piezoelectric "actuator" element 12, which, in turn, piezoelectrically generates voltage at wires 44 proportional to the imposed forces. Thus, in the "receiver" mode the piezoelectric "actuator" element 12 functions as a sensor rather than as an actuator.

While the above description contains many specificities, these should not be construed as limitations on the scope of the invention, but rather as an exemplification of one preferred embodiment thereof. Many other variations are possible, for example:

A power cord may be provided for connection to a typical a/c wall outlet, operating at a frequency of 60 Hertz;

Adhesives, preferably polyimides, other than LARC-Si TM may be used to bond adjacent layers of the flextensional actuators together;

The actuators 12 may be normally curved when non-energized, or they may alternatively be normally flat when non-energized; and, if normally flat, may be secured to the rib 30 with either face directed upward;

Each actuator 12 may be attached to the rib 30 by a screw 56 through its center (instead of between the actuators 12) as illustrated in FIG. 5 and FIG. 6;

The rib 30 may be replaced with a series of individual bosses to which individual actuators 12 may be attached;

The actuators may be arranged into various arrays, and need not necessarily be located in a single line down the middle of the base of the tool as shown;

The work medium-engaging bottom member of the tool may be modified so that the tool may be used as a polisher, a sander, or a mixer, etc.;

The tool may be used to vibrate or smooth plastic/slurry mixtures other than concrete;

The tool may be constructed with larger dimensions and/or comprising transducer modules so that it can be used as a screed, a float, an edger or other similar concrete finishing tools;

Non-"TPP" piezoelectric actuators, including magnetostrictive, and ferroelectric actuators, may be used to produce the acoustic waves;

The rib 30 may be carved out of or molded to the top 20*b* of the casing 20 instead of being a completely separate piece;

The number of actuators may vary; and,

The current may be adjusted by an external a/c voltage generator. In this modification of the invention any frequency that is desired within the target range may be applied.

Accordingly, the scope of the invention should be determined not by the embodiment illustrated, but by the appended claims and their legal equivalents.

What is claimed is:

1. An acoustic transducer, comprising:

a transducer housing surrounding a transducer housing interior;

said transducer housing comprising a top portion and a bottom portion removably attached to said top portion;

said bottom portion having a thickness measurable between an interior surface and an exterior surface;

said exterior surface being adapted to engage a work medium;

said interior surface having a first acoustic impedance;

said exterior surface having a second acoustic impedance;

said top portion having a third acoustic impedance different from said first acoustic impedance;

a liquid disposed within said transducer housing interior;

wherein said liquid has an acoustic impedance;

a value of said acoustic impedance of said liquid substantially matching said first acoustic impedance of said interior surface;

a piezoelectric member immersed in said liquid; and, energizing means for electrically energizing said piezoelectric member;

said energizing means comprising means for applying an alternating voltage to said piezoelectric member at a first frequency.

2. The acoustic transducer of claim 1, wherein said work medium has an acoustic impedance;

a value of said acoustic impedance of said work medium substantially matching said second acoustic impedance of said exterior surface.

3. The device according to claim 2, wherein said third acoustic impedance of said top portion differs from said acoustic impedance of said liquid whereby said top portion is reflective of acoustic energy within said liquid.

4. The device according to claim 2, wherein said bottom portion has an acoustic impedance gradient between said interior surface and said exterior surface.

5. The device according to claim 4, wherein a density of a material of construction of said bottom portion varies between said interior surface and said exterior surface.

6. The device according to claim 5, wherein said density of the material of construction of said bottom portion varies uniformly between said interior surface and said exterior surface.

7. The device according to claim 6, wherein said piezoelectric member is prestressed.

* * * * *